(12) United States Patent
Horton et al.

(10) Patent No.: US 7,791,168 B2
(45) Date of Patent: Sep. 7, 2010

(54) TECHNIQUES FOR PROVIDING DECOUPLING CAPACITANCE

(75) Inventors: Raymond R. Horton, Plains, NY (US); John U. Knickerbocker, Wappinigers Falls, NY (US); Edmund J. Sprogis, Underhill, VT (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 11/930,698

(22) Filed: Oct. 31, 2007

(65) Prior Publication Data
US 2008/0067628 A1  Mar. 20, 2008

Related U.S. Application Data

(62) Division of application No. 11/201,572, filed on Aug. 11, 2005, now Pat. No. 7,435,627.

(51) Int. Cl.
H01L 29/00 (2006.01)
H01L 23/52 (2006.01)
H01L 23/04 (2006.01)
H01L 23/053 (2006.01)

(52) U.S. Cl. .............. 257/532; 257/528; 257/691; 257/698; 257/700; 257/E23.173

(58) Field of Classification Search ........... 257/691, 257/698, 700, E23.173, 528, 532
See application file for complete search history.

(56) References Cited

U.S. PATENT DOCUMENTS

| | | | | |
|---|---|---|---|---|
| 4,322,778 A * | 3/1982 | Barbour et al. | ............. | 361/794 |
| 4,349,862 A * | 9/1982 | Bajorek et al. | ............. | 361/762 |
| 6,098,282 A * | 8/2000 | Frankeny et al. | ............. | 29/852 |
| 6,388,207 B1 * | 5/2002 | Figueroa et al. | ............. | 174/262 |
| 6,535,075 B2 * | 3/2003 | Frech et al. | ................ | 333/17.1 |
| 6,611,419 B1 * | 8/2003 | Chakravorty | ............ | 361/306.3 |
| 6,791,133 B2 | 9/2004 | Farooq et al. | | |
| 6,882,544 B2 * | 4/2005 | Nakamura et al. | .......... | 361/765 |
| 6,919,226 B2 * | 7/2005 | Ogawa et al. | ............... | 438/108 |
| 7,199,307 B2 * | 4/2007 | McCormack et al. | ....... | 174/260 |
| 7,375,412 B1 * | 5/2008 | Palanduz et al. | ............ | 257/532 |
| 7,613,007 B2 * | 11/2009 | Amey et al. | ................. | 361/763 |
| 2004/0027813 A1 * | 2/2004 | Li | .............................. | 361/767 |
| 2004/0085120 A1 * | 5/2004 | Pitts | ............................ | 327/525 |

(Continued)

FOREIGN PATENT DOCUMENTS

DE  100 56 519 A1  11/2000

(Continued)

*Primary Examiner*—Ida M Soward
(74) *Attorney, Agent, or Firm*—Ryan, Mason & Lewis, LLP

(57) ABSTRACT

Techniques for electronic device fabrication are provided. In one aspect, an electronic device is provided. The electronic device includes at least one interposer structure having one or more vias and a plurality of decoupling capacitors integrated therein, the at least one interposer structure being configured to allow for one or more of the plurality of decoupling capacitors to be selectively deactivated. In another aspect, a method of fabricating an electronic device including at least one interposer structure having one or more vias and a plurality of decoupling capacitors integrated therein includes the following step. One or more of the plurality of decoupling capacitors are selectively deactivated.

15 Claims, 9 Drawing Sheets

U.S. PATENT DOCUMENTS

| | | |
|---|---|---|
| 2004/0108587 A1 | 6/2004 | Chudzik et al. |
| 2004/0207042 A1* | 10/2004 | McCormack et al. ....... 257/532 |
| 2006/0012966 A1* | 1/2006 | Chakravorty ................ 361/763 |
| 2006/0133057 A1* | 6/2006 | McGregor et al. .......... 361/763 |
| 2006/0279940 A1* | 12/2006 | Chakravorty et al. ........ 361/763 |
| 2006/0284280 A1* | 12/2006 | Borland et al. .............. 257/532 |
| 2007/0273515 A1* | 11/2007 | MacKenzie et al. ...... 340/572.1 |

FOREIGN PATENT DOCUMENTS

| | | |
|---|---|---|
| EP | 1 041 831 A1 | 10/2000 |
| EP | 1 069 792 A1 | 1/2001 |
| WO | WO 00 79811 A1 | 12/2000 |

\* cited by examiner

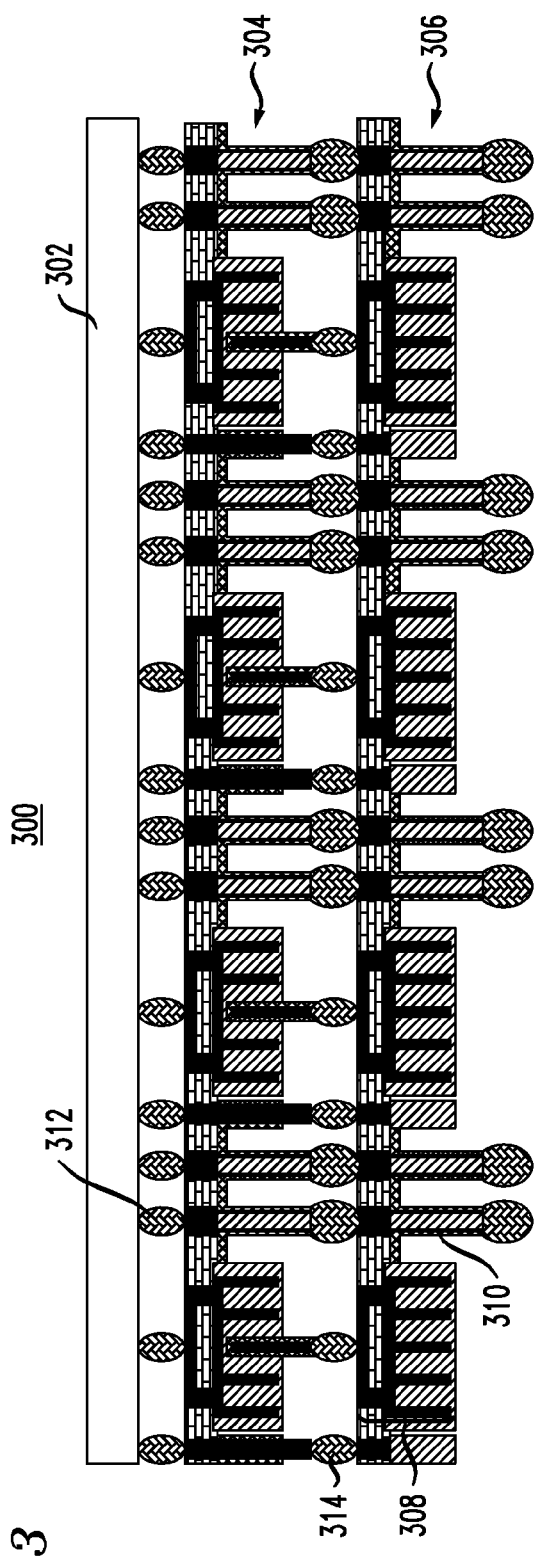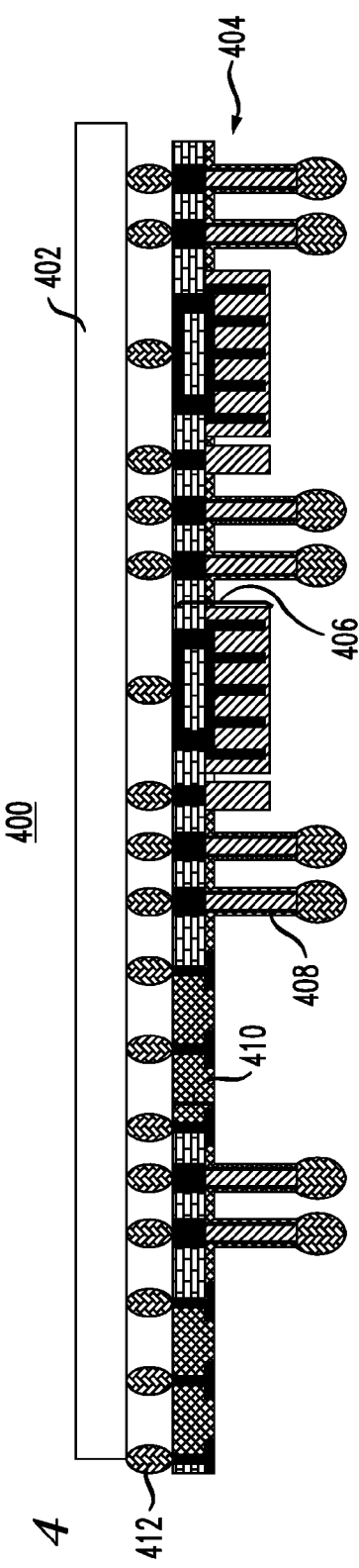
FIG. 3
FIG. 4

600

600

700

1000

TECHNIQUES FOR PROVIDING DECOUPLING CAPACITANCE

CROSS REFERENCE TO RELATED APPLICATIONS

This application is a Divisional Application of U.S. patent application Ser. No. 11/201,572, filed Aug. 11, 2005 now U.S. Pat. No. 7,435,627, which is incorporated by reference herein.

FIELD OF THE INVENTION

The present invention relates to electronic devices and, more particularly, to techniques for providing decoupling capacitance in electronic devices.

BACKGROUND OF THE INVENTION

Many electronic devices use a number of separate integrated circuit (IC) chips. Typically, each IC chip is mounted individually in a separate package that is connected to a printed circuit board which provides power and signal interconnections to the IC chips. However, when a device requires a large number of IC chips, individually packaging and mounting each chip greatly increases the area on the printed circuit board required to interconnect all the chips. Additionally, as device speeds increase, it is more important to minimize the path lengths between IC chips themselves, as well as between the IC chips and other electronic components connected to them.

To decrease printed circuit board space, distance between IC chips and complexity of interconnections, many devices now use multichip modules (MCMs) that incorporate a number of IC chips into one package. Integrating a number of IC chips into one package reduces the distance between IC chips, thus permitting greater device speeds. The MCMs usually provide power and signal interconnections to the individual IC chips from an underlying ceramic substrate.

MCMs may be two-dimensional, that is all the IC chips of a package are mounted on a planar substrate, or three-dimensional, where IC chips are mounted above or below a ceramic substrate, another IC chip, or an interposer. An interposer is a structure on which various electronic components and interconnections are formed and is usually located between an IC chip and a ceramic substrate, another interposer, or a printed circuit board.

As the switching speed of devices increases, it is important to provide a decoupling capacitor in close proximity to the IC chips of the multichip module. Decoupling capacitors serve as charge reservoirs to support instantaneous current surges that invariably accompany simultaneous circuit switching. Conventionally, decoupling capacitors have been incorporated into the ceramic substrate which increases the complexity of the ceramic substrate, thus decreasing production yields, as well as uses up space on the ceramic substrate, which is at a premium.

Further, during device production, it is inevitable that one or more components of the device produced will be defective, which may increase as components decrease in size. Devices containing a defective component then have to be discarded, or at the very least, the part(s) of the device containing the defective component has to be discarded. For example, if a ceramic substrate has one or more defective decoupling capacitors, it has to be discarded. As such, production yields will similarly be decreased.

Therefore, techniques for producing electronic devices that maximize available space while maintaining proper path lengths between components and minimize the effects of defective components would be desirable.

SUMMARY OF THE INVENTION

Electronic devices and techniques for the fabrication thereof are provided. In one aspect of the invention, an electronic device is provided. The electronic device comprises at least one interposer structure having one or more vias and a plurality of decoupling capacitors integrated therein, the at least one interposer structure being configured to allow for one or more of the plurality of decoupling capacitors to be selectively deactivated.

In another aspect of the invention, a method of fabricating an electronic device comprising at least one interposer structure having one or more vias and a plurality of decoupling capacitors integrated therein comprises the following step. One or more of the plurality of decoupling capacitors are selectively deactivated.

A more complete understanding of the present invention, as well as further features and advantages of the present invention, will be obtained by reference to the following detailed description and drawings.

BRIEF DESCRIPTION OF THE DRAWINGS

FIG. 3 is a diagram illustrating a cross-sectional view of an exemplary electronic device comprising multiple interposer structures each having a plurality of capacitors integrated therein according to an embodiment of the present invention;

FIG. 4 is a diagram illustrating a cross-sectional view of an exemplary electronic device comprising an interposer structure having a plurality of capacitors and active circuits integrated therein according to an embodiment of the present invention;

DETAILED DESCRIPTION OF PREFERRED EMBODIMENTS

Figure 1:
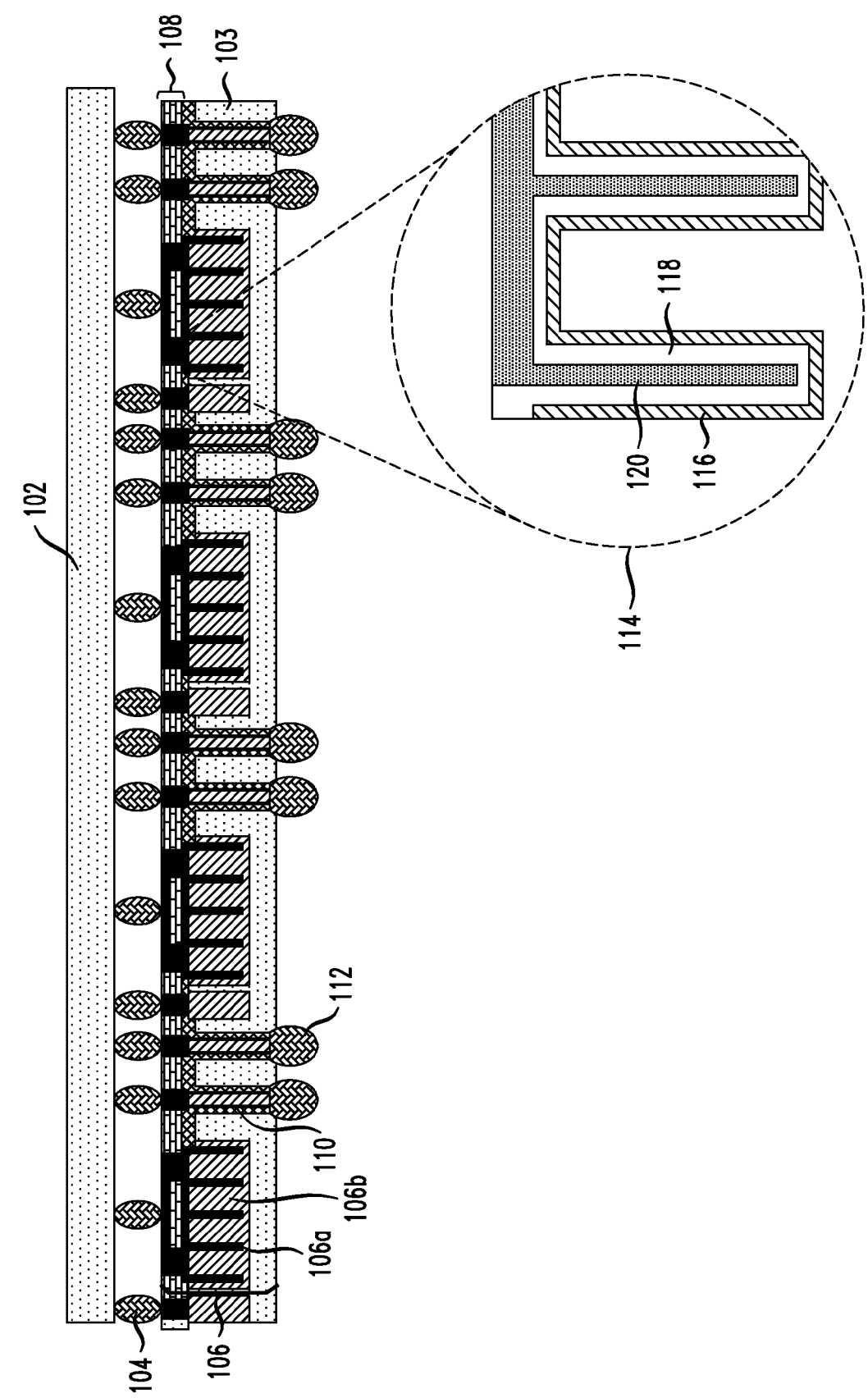
FIG. 1 is a diagram illustrating a cross-sectional view of an exemplary electronic device comprising an interposer structure having a plurality of capacitors integrated therein according to an embodiment of the present invention.

FIG. 1 is a diagram illustrating a cross-sectional view of exemplary electronic device 100 comprising an interposer structure having a plurality of capacitor is integrated therein. Electronic device 100 comprises integrated circuit (IC) chip 102 and interposer structure 103 linked by a plurality of interconnections 104. Interconnections 104 may comprise any suitable electrically conductive material, including, but not limited to solder materials, such as lead-tin or tin-silver solder, copper, and combinations comprising at least one of the foregoing materials.

Interposer structure 103 comprises a plurality of decoupling capacitors 106 and vias 110. Decoupling capacitors 106, as shown in FIG. 1, comprise trench capacitors. However, as will be described in detail below, other suitable types of decoupling capacitors, such as parallel plate capacitors may be used instead of, or in addition to, trench capacitors.

As shown, for example, in expanded view 114, a trench decoupling capacitor comprises a first electrode, e.g., first electrode 116, and a second electrode, e.g., second electrode 120, separated by a dielectric layer, e.g., dielectric layer 118. Techniques for fabricating a decoupling capacitor, including suitable materials for forming each of the first electrode, the second electrode and the dielectric layer will be described in detail below.

Vias 110 may comprise silicon vias that extend vertically through the thickness of interposer structure 103 (referred to hereinafter as "silicon through vias"). According to one exemplary embodiment, one or more of vias 110 may comprise a conductive core surrounded by a liner, which is in turn surrounded by an insulator. Further, one or more of vias 110 may comprise a conductive core surrounded by an insulator. Additionally, one or more of vias 110 may comprise substantially a conductive material. The vias can be made from (i) conductors, such as metal conductors, including Cu, W, Ni, Pt, Ti, Ta, Co, Nb, Mo, V, Zr, Ir, Re, Rh or their alloys or W, Ti, Ta, Co nitrides and silicides; and where Cu and W metal conductors are preferred, (ii) liner can be, for example, TiN/Ti, TaN/Ta or alternate liner material that can provide adhesion between metal conductor and insulator and can provide a diffusion barrier during processing, and (iii) an insulator, such as SiO2, SiOx, SiN or an alternate electrical insulator. Another option for the via may comprise an annular structure with a central insulator or a semiconductor, such as Si, insulator, liner, conductor, liner and insulator as one describes a cross section from center to outside of via where materials such as those above can be utilized.

Interposer structure 103 further comprises adhesion and barrier layers 108 which contain, for example, conductive wiring and insulating layers. Layers in 108 may be comprised of conductors, such as metals with features such as vias, wires, electrodes and surface pads and fuses, where (i) conductors, such as metal conductors, including Al, Cu, W, Ni, Pt, Ti, Ta, Co, Nb, Mo, V, Zr, It, Re, Rh or their alloys or W, Ti, Ta, Co nitrides and silicides; and where Cu and Al metal conductors are preferred, (ii) liner can be, for example, TiN/Ti, TaN/Ta or an alternate liner material that can provide adhesion between metal conductor and insulator and can provide a diffusion barrier during processing, and (iii) an insulator, such as SiO2, SiOx, SiN, Polyimide, Matrimide or a dielectric, such as HfO2, HfSiOx, Al2O3, BaTiO3 or composites therein or an alternate electrical insulator.

Electronic device 100 further comprises interconnections 112. Like interconnections 104, interconnections 112 may comprise any suitable electrically conductive material, including, but not limited to solder materials, such as lead-tin or tin-silver, copper and combinations comprising at least one of the foregoing materials, Interconnections 112 may serve to connect IC chip 102, through interposer structure 103, to a ceramic substrate, another interposer or a printed circuit board (not shown).

Figure 2A:
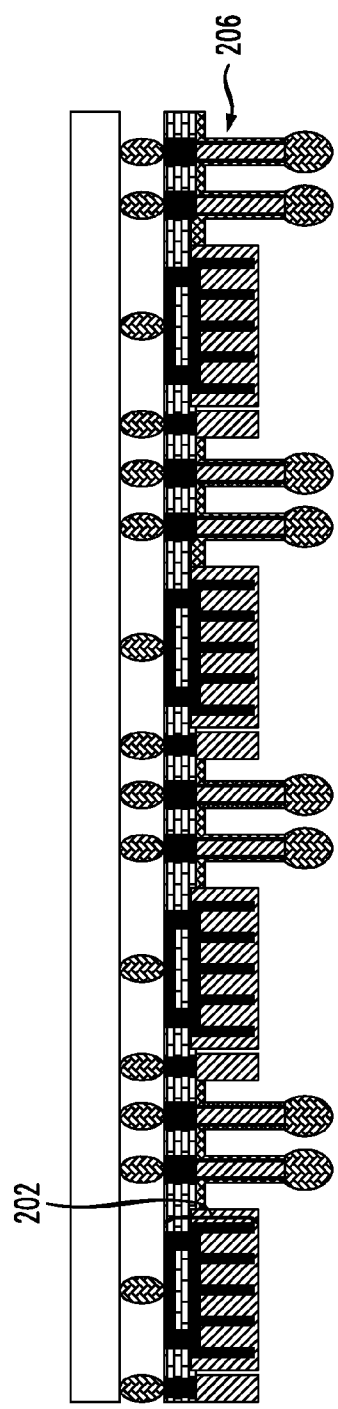
FIGS. 2A-C are diagrams illustrating cross-sectional views of exemplary electronic devices comprising interposer structures having different types of decoupling capacitors integrated therein according to an embodiment of the present invention.
Figure 2B:
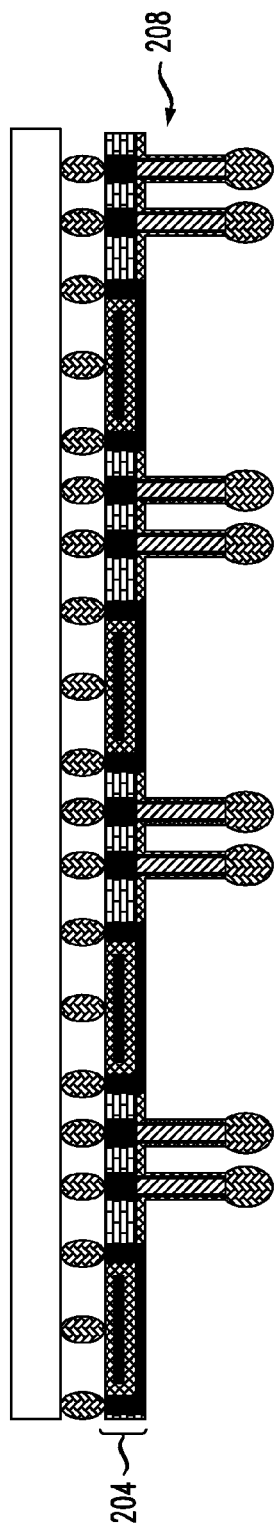
Figure 2C:
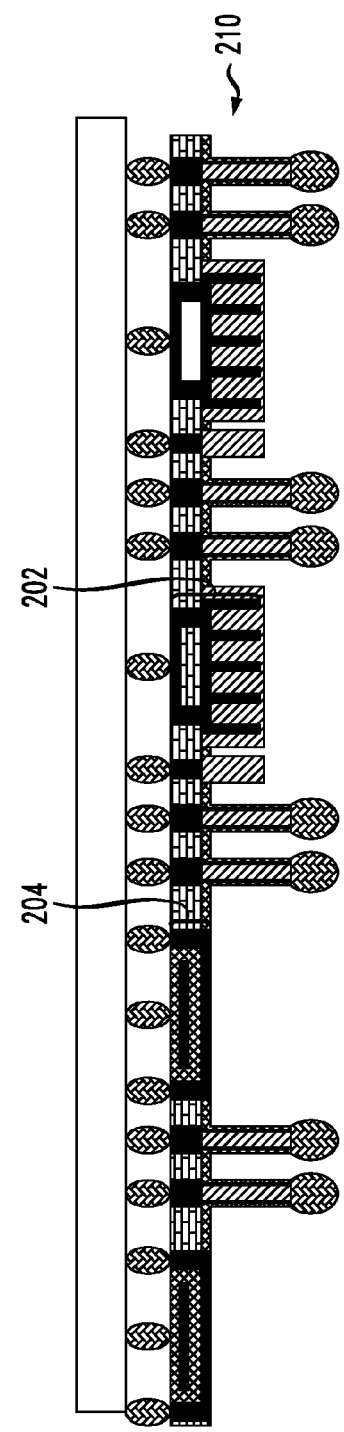

FIGS. 2A-C are diagrams illustrating cross-sectional views of exemplary electronic devices comprising interposer structures having different types of decoupling capacitors integrated therein. In FIG. 2A, interposer structure 206 comprises a plurality of trench decoupling capacitors 202.

As described, for example, in conjunction with the description of FIG. 1, above, other types of decoupling capacitors, e g, other than trench decoupling capacitors, may be used in accordance with the present teachings. For example, as shown in FIG. 2B, a plurality of parallel plate decoupling capacitors 204 are used in interposer structure 208 rather than trench decoupling capacitors. For parallel plate capacitors, an insulator or dielectric is used to separate two parallel electrodes. For purposes of structural integrity and processing, liners or adhesion layers may be placed on either side of the electrodes and vias, wires or conductors are connected to each side of the minimum of two electrodes that can then provide current or voltage potential across the electrodes. For parallel plate capacitors built on the surface of a silicon wafer, the metal electrode-insulator-metal electrode can be deposited on the surface of an insulator on Silicon to form the capacitor. First, (i) the electrode or conductors, such as metal conductors including Al, Cu, W, Ni, Pt, Ti, Ta, Co, Nb, Mo, V, Zr, Ir, Re, Rh or their alloys or W, Ti, Ta, Co nitrides and silicides could be deposited as the bottom electrode, then (ii) a liner, such as TiN/Ti, TaN/Ta or an alternate liner material may be used if needed, then (iii) an insulator or dielectric, such as SiO2, SiOx, SiN, HfO2, HfSiOx, Al2O3, BaTiO3, barium zirconate titanate, barium strontium titanate or doped barium titanate modified with Pb, Nb, W, Ca, Mg and/or Zn may be utilized or an organic polymer such as polyimide or an alternate electrical insulator, followed by (iv) deposition of the second liner if needed, and, then, (v) a second conductive electrode. Additional liner and insulator or insulator may provide an enclosure of the structure other than connections for electrical connection. The processes may include deposition of a bottom electrode, such as a conductor.

As further described, for example, in conjunction with the description of FIG. 1, above, multiple types of decoupling capacitors may be integrated in the same interposer structure. As shown in FIG. 2C, a plurality of trench decoupling capacitors 202 and a plurality of parallel plate decoupling capacitors 204 are integrated in the same interposer structure 210. While configurations are anticipated herein where capacitors are grouped in blocks in the interposer structure, as shown in FIG.

2C, this configuration is not required, and configurations ate anticipated wherein the different types of decoupling capacitors are staggered, e.g., alternating trench and parallel plate decoupling capacitors. The organization of capacitors within the interposer structure will be described in detail below.

The presence of trench decoupling capacitors is beneficial as depending on design, they provide the greatest capacitance per unit area of capacitor, e.g., as compared to parallel plate decoupling capacitors. Depending on design with design of a low resistance metal electrode or significant doped electrode, the presence of parallel plate decoupling capacitors is beneficial as they provide very low inductance for high frequency IT applications where inductance values are often measured in tenths to few pico-henry range and low RC delay constant such may be in the few to tens of picosecond range and, as will be described in detail below, allow for the incorporation of high k dielectrics in the capacitor. Therefore, depending on the needs of a particular application, the interposer structure supporting a combination of trench and parallel plate decoupling capacitors may be employed.

Techniques for fabricating capacitors are described, for example, in U.S. Pat. No. 6,791,133 issued to Farooq et al., entitled "Interposer Capacitor Built on Silicon Wafer and Joined to a Ceramic Substrate" and in U.S. Patent Application No. 2004/0108587 filed by Chudzik et al., entitled "High Density Chip Carrier With Integrated Passive Devices," the disclosures of which are incorporated by reference herein.

According to the techniques presented herein, a trench decoupling capacitor, for example, may be formed in the interposer structure by first patterning a trench in the interposer structure. Then a metal, including, but not limited to, tungsten, titanium, tantalum, cobalt, their nitrides and silicides, zirconium, hafnium, silicon-germanium and combinations comprising at least one of the foregoing metals, is deposited in the trench using one or more of atomic layer deposition (ALD) and chemical vapor deposition (CVD) to form a first electrode, e.g., first electrode 116 of FIG. 1, described above.

ALD, CVD or any another similar deposition technique(s) may then be used to deposit a dielectric material forming a dielectric layer, e.g., dielectric layer 118 of FIG. 1, described above. According to one exemplary embodiment, the dielectric layer comprises a high k dielectric material. Suitable high k dielectric materials, include, but are not limited to, silicon nitride, silicon oxinitride, tantalum oxide, titanium oxide, aluminum oxide, zirconium oxide, hafnium oxide, hafnium silicon oxide, barium strontium, barium strontium titanate, barium zirconium titanate, barium titanium oxide, and combinations comprising at least one of the foregoing materials.

In general, the use of a high k dielectric material increases the capacitance of a capacitor. According to one exemplary embodiment, a combination of a high k dielectric material(s) and low k dielectric material(s) is used to achieve a desired level of capacitance. Suitable low k dielectric materials, include, but are not limited to, low K materials, such as SiO2, SiN and high K materials may include HfO2, HfSiOx, Al2O3, BaTiO3, barium zirconate titanate, barium strontium titanate or doped barium titanate modified with Pb, Nb, W, Ca, Mg and or Zn. Depending on the size of the capacitance, application, processing, costs, voltage, breakdown voltage, a combination of high and low K materials may be used for different dielectrics in the integrated capacitor. A second electrode, e.g., second electrode 120 of FIG. 1, described above, is then formed by depositing a second electrode material into the trench. Suitable materials for forming the second electrode include, but are not limited to tungsten, titanium, tantalum, copper, nickel, platinum, cobalt, niobium, molybdenum, vanadium, zirconium, iridium, rhenium, rhodium, alloys thereof and combinations comprising at least one of the foregoing materials, and may be deposited using one or more of ALD, CVD, plating and physical vapor deposition (PVD).

Alternatively, the second electrode may comprise polycrystalline silicon that is doped, e.g., at its surface, so as to be conductive. The first or second electrodes may utilize doped silicon or doped polysilicon which enables them to be electrically conductive where dopants such as AS, B or P may be implanted with concentrations such as $10^{-17}$ to $10^{-21}$ atoms/$cm^2$ which would provide low resistivity of under 0.01 ohm-cm. It is important to note that silicon or polycrystalline silicon can act as either an insulator if oxidized or nitrided, a semiconductor with low dopant concentration or conductor with high dopant level as given above, or a conductor, depending on the amount of doping and/or the content of the dopant. Polycrystalline silicon, when acting as a conductor, however, does provide a level of resistance such as copper conductors which have $1.67 \times 10^{-6}$ ohm-cm resistivity, which makes it unfavorable for some high frequency applications. In these circumstances, it may be desirable to use only metal electrodes, or metal electrodes in combination with polycrystalline silicon electrodes in the decoupling capacitor. This may be desired in but not limited to applications requiring significant simultaneous switching (100's to many thousand's of circuits), high frequency (>1 GHz) and/or higher power/power density (40 watts/$cm^2$) which if not adequately supported with decoupling capacitors might fail to operate.

According to yet another exemplary embodiment of the present invention, as highlighted above and as illustrated in FIG. 2C, the decoupling capacitors may be organized in "discrete decoupling blocks" within the interposer structure. For example, in FIG. 2C, the two parallel plate decoupling capacitors are grouped into one discrete decoupling block within the interposer structure, and the two trench decoupling capacitors are grouped into a second discrete decoupling block within the interposer structure. Organizing the decoupling capacitors in discrete blocks may be advantageous for some applications such as multiple macro designs of different voltage on one chip or different voltages from multiple die on a carrier with integrated capacitance or to support chip to chip signal integrity across two or more die as it provides a uniformity of coupling, and thus a uniformity of voltage transfer, across each block of the interposer.

FIG. 3 is a diagram illustrating a cross-sectional view of exemplary electronic device 300 comprising multiple interposer structures integrated therein each having a plurality of capacitors. Electronic device 300 comprises IC chip 302 and interposer structures 304 and 306 IC chip 302 is connected to interposer structure 304 by interconnections 312, and interposer structure 304 is connected to interposer structure 306 by interconnections 314. As with interconnections 104 and 112, described in conjunction with the description of FIG. 1, above, interconnections 312 and 314 may comprise any suitable electrically conductive material, including, but not limited to, solder materials, such as lead-tin or tin-silver solder, copper and combinations comprising at least one of the foregoing materials.

According to an exemplary embodiment, each of interconnections 312 and 314 comprises copper. Copper is advantageous as it provides a permanent bond with high current carrying capacity and little or no electron migration. As such, interposer density can be increased. Alternatively, one or more of interconnections 312 and 314 may comprise copper and the remainder of interconnections 312 and 314 comprise solder. Copper interconnection might be used for high current application, for single chip to decoupling capacitor and solder for multiple chips to a carrier, decoupling capacitor or package. Reason would be for lowest cost depending on assembly, chip, testing costs, reliability and yields.

Interposer structures 304 and 306 comprise multiple trench decoupling capacitors 308 and silicon through vias 310. As was described, for example, in conjunction with the description of FIGS. 2A-C, above, parallel plate decoupling capacitors may be used in place of, or in addition to, trench decoupling capacitors within the interposer structure. Therefore, although not shown in FIG. 4, parallel plate decoupling capacitors may be employed in place of, or in addition to, one or more of trench decoupling capacitors 308.

Employing multiple interposer structures having integrated capacitors in an electronic device can provide for a greater amount of capacitance for a given unit area of space, e.g., as opposed to a single interposer structure, while at the same time maintaining proper path lengths to the IC chips.

Another advantage of electronic device 300 is that it may be configured to support multiple voltages. This can be done based on wiring grid design within one layer or with use of multiple levels to provide multiple voltages to those circuits and components as needed from 1 to >6 voltages as may be required for some IT chip applications. With current electronic devices, the ability to support multiple voltage applications is important. For example, a plurality of processors may be located on the same IC chip. To operate these processors at multiple speeds would require multiple voltages. The configuration and interrelationship of interposer structures 304 and 306 allow for these multiple voltages applications based on capacitor design, wiring and interconnection.

FIG. 4 is a diagram illustrating a cross-sectional view of exemplary electronic device 400 comprising an interposer structure having a plurality of capacitors and active circuits integrated therein. Electronic device 400 comprises IC chip 402 and interposer structure 404 connected by interconnections 412. Interposer structure 404 comprises a plurality of trench decoupling capacitors 406 and silicon through vias 408. The use of trench decoupling capacitors is merely exemplary and, as described above, other suitable capacitors, such as parallel plate decoupling capacitors, may be employed in place of, ox in addition to, trench decoupling capacitors 406.

Also included in interposer structure 404 are a plurality of active circuits 410. Placing one or more active circuits in the interposer structure helps maximize available space in the electronic device. Further, the techniques for selectively eliminating one or more defective capacitors, as will be described in detail below, may be employed with regard to any of the embodiments described herein and further to selectively eliminate one or more of active circuits 410.

Figure 5:
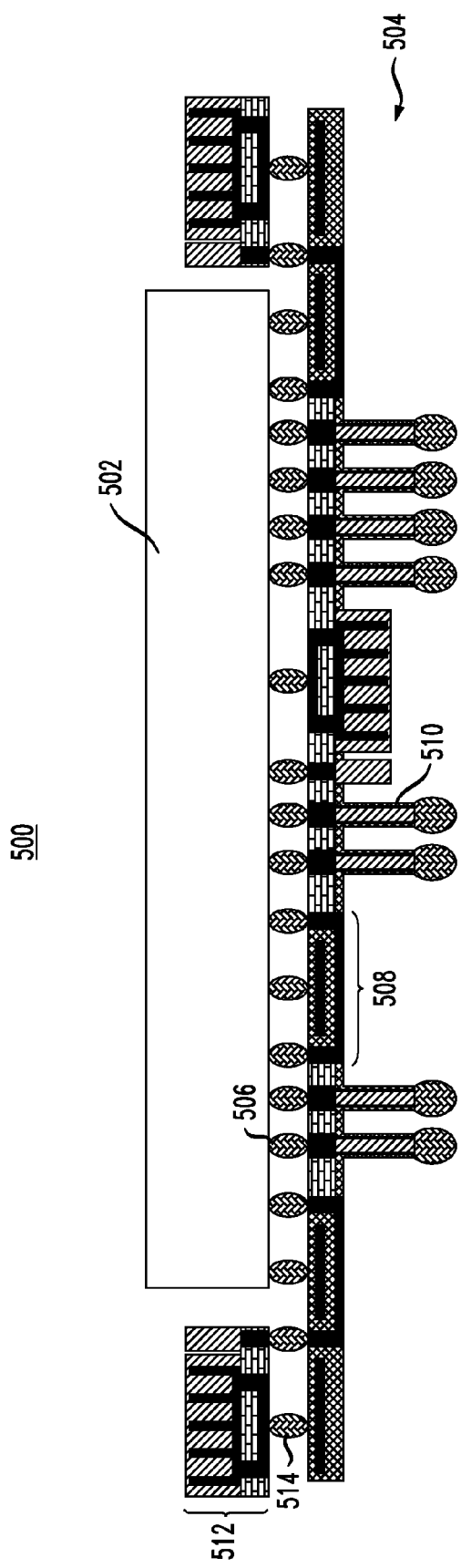
FIG. 5 is a diagram illustrating a cross-sectional view of an exemplary electronic device comprising an interposer structures having a plurality of decoupling capacitors integrated therein as well as a plurality of discrete capacitors associated therewith according to an embodiment of the present invention.

FIG. 5 is a diagram illustrating a cross-sectional view of exemplary electronic device 500 comprising an interposer structure having a plurality of capacitors integrated therein, as well as a plurality of discrete capacitors associated therewith. Electronic device 500 comprises IC chip 502 and interposer structure 504 connected by interconnections 506. Interposer structure 504 comprises a plurality of integrated decoupling capacitors 508, including trench decoupling capacitor and parallel plate decoupling capacitors, and silicon through vias 510. Electronic device 500 further comprises one or more discrete decoupling capacitors 512 connected to interposer structure 504 by interconnections 514. While the discrete decoupling capacitors shown ate trench decoupling capacitors, according to the techniques presented herein, one or more of the discrete decoupling capacitors may comprise a parallel plate decoupling capacitor.

Having one or more discrete decoupling capacitors associated with the interposer structure may be advantageous to achieve a desired level of capacitance. For example, when high k dielectric materials are used, it may be advantageous to employ the high k dielectric materials in the discrete decoupling capacitor instead of in the decoupling capacitors integrated in the interposer structure. In some cases, a high K dielectric may be compatible with discrete capacitor fabrication but not possible at reasonable cost for highly integrated capacitors. Some BaTiO3 dielectrics with sizes where Coefficient of thermal expansion makes the material not compatible for reliability reasons with standard semiconductor process steps due to thermal cycling and potential cracking of defects. However, the application needs may dictate need for supplemental discrete capacitors.

Figure 6A:
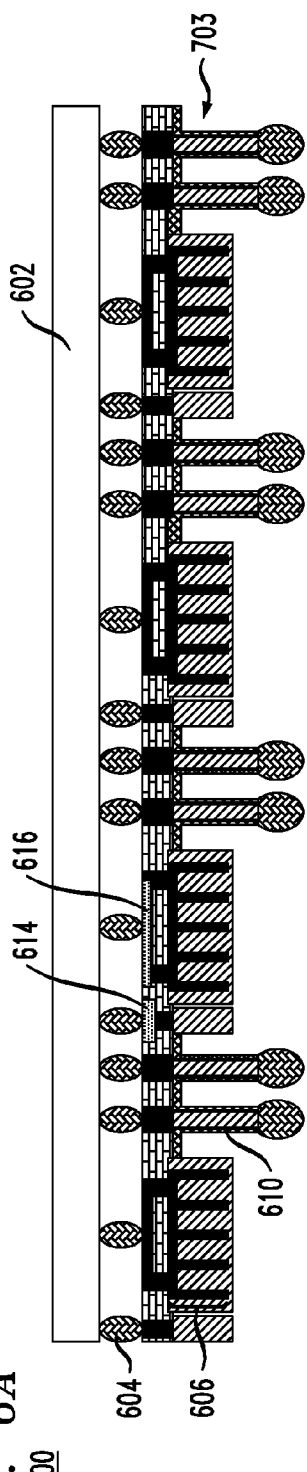
FIG. 6A is a diagram illustrating a cross-sectional view of an exemplary electronic device comprising an interposer structure having a plurality of capacitors integrated therein, one or more of which is defective according to an embodiment of the present invention.

FIG. 6A is a diagram illustrating a cross-sectional view of exemplary electronic device 600 comprising an interposer structure having a plurality of capacitors integrated therein, one or more of which is defective. In FIG. 6A, electronic device 600, like electronic device 100, described in conjunction with the description of FIG. 1, above, comprises IC chip 602 connected to interposer structure 603 by a plurality of interconnections 604. Interposer structure 603 comprises a plurality of trench decoupling capacitors 606 and silicon through vias 610.

As shown in FIG. 6A, the second decoupling capacitor from the left is defective. For example, as device dimensions decrease, an increasing number of defective capacitors will be produced, as even small errors during production can lead to non-functional capacitors. By way of example only, defects in the formation of one or more of the plates of the capacitor can result in shorting. Instead of discarding the entire interposer structure containing the one defective capacitor, the techniques provided herein allow for the selective deactivation of one or more individual capacitors in the interposer structure. According to the teachings presented herein, the deactivation is "selective" as one or mote of the decoupling capacitors can be deactivated, without effecting the remaining capacitors.

In the exemplary embodiment shown in FIG. 6A, a passivation layer, e.g., passivation layer 616, is formed over the defective capacitor to selectively deactivate the defective capacitor and without effecting the other decoupling capacitors in the interposer structure. As used herein, the term "passivation layer" refers generally to any layer that can be applied to one or more surfaces of the capacitor and its associated wiring that can effectively isolate, electrically, the capacitor from the interposer structure. For example, according to an exemplary embodiment, passivation layer 616 comprises an organic polymer, including, but not limited to a polyimide, matromide or alternate polymer and is deposited using conventional deposition techniques, including, but not limited to dispense and cure of the polymer films. The passivation may be on one contact such as 614 or both electrical connections such as 614 and 616 where it is desired to complete electrically isolate the defective or unneeded capacitor and would depend on design of the circuitry and application.

Figure 6B:
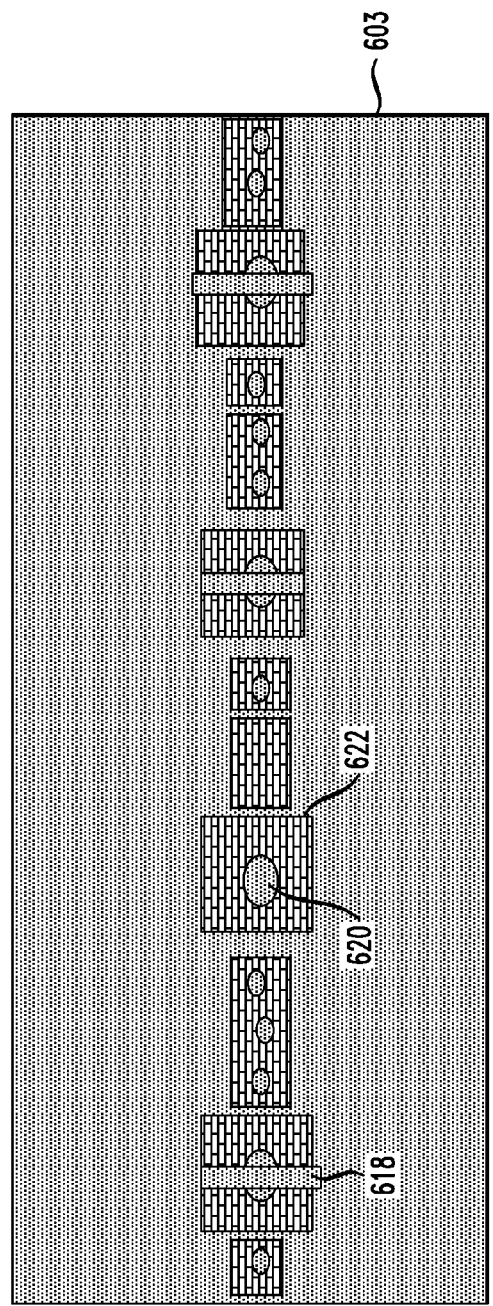
FIG. 6B is a diagram illustrating a top-down view of the exemplary electronic device shown in FIG. 6A comprising an interposer structure having a plurality of capacitors integrated therein, one or more of which is defective according to an embodiment of the present invention.

FIG. 6B is a diagram illustrating a top-down view of exemplary electronic device 600 comprising an interposer structure having a plurality of capacitors integrated therein, one or more of which is defective. Specifically, in FIG. 6B, IC chip 602 and passivation layers 614 and 616 have been removed for clarity. As shown, interposer structure 603 comprises a plurality of conductive points 620 which act as electrical conduits to, e.g., the decoupling capacitors and vias integrated in interposer structure 603. Conductive points 620 ate surrounded by an insulating material 622. Suitable insulating materials include, but are not limited to material examples, such as polyimides and electrically insulating epoxies.

According to the exemplary embodiment shown in FIG. 6B, at least a portion, e.g. a top surface, of interposer structure 603 serves as a power plane of electronic device 600. Therefore, conductive straps 618 can serve to connect, e.g., the decoupling capacitors and vias, through conductive points 620 to the power plane of electronic device 600.

To selectively deactivate one or more defective capacitors from electronic device 600, laser deletion techniques may be employed to remove the conductive straps associated with defective decoupling capacitors and thus selectively disconnect those defective capacitors from the other decoupling capacitors of the device. For example, FIG. 6B shows that the conductive strap has been removed from the conductive point corresponding to the second decoupling capacitor from the left (see FIG. 6A).

Figure 7:
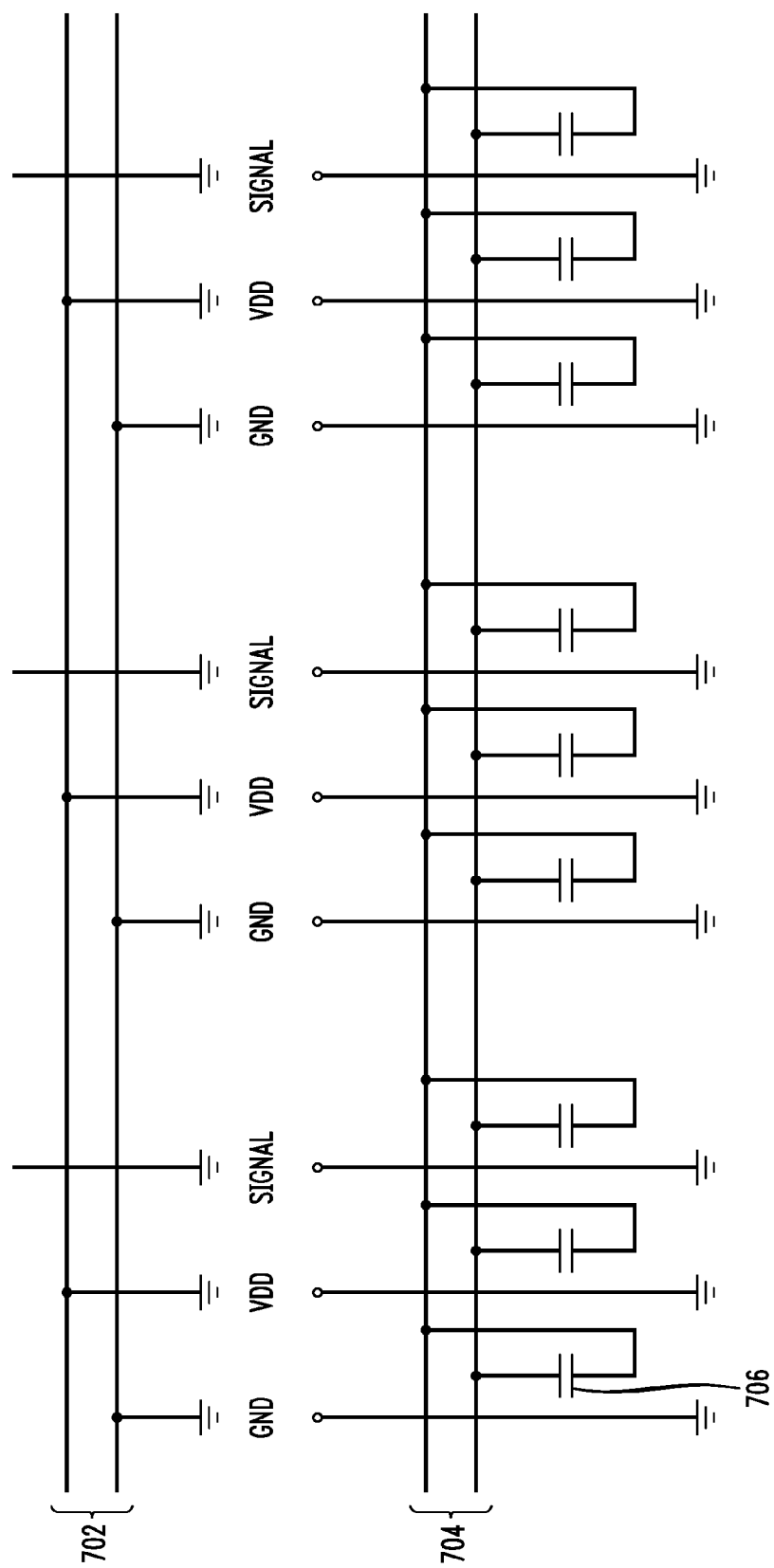
FIG. 7 is a circuit diagram illustrating an exemplary electronic device comprising an interposer structure having a plurality of capacitors integrated therein according to an embodiment of the present invention.

FIG. 7 is a circuit diagram illustrating an exemplary electronic device 700 comprising an interposer structure having a plurality of capacitors integrated therein. Electronic device 700 comprises IC chip 702 and interposer structure 704. Interposer structure 704 provides a connection for ground (GND), power (VDD) and signal. Decoupling capacitors, such as decoupling capacitor 706, are associated with the GND and VDD circuits.

Figure 8:
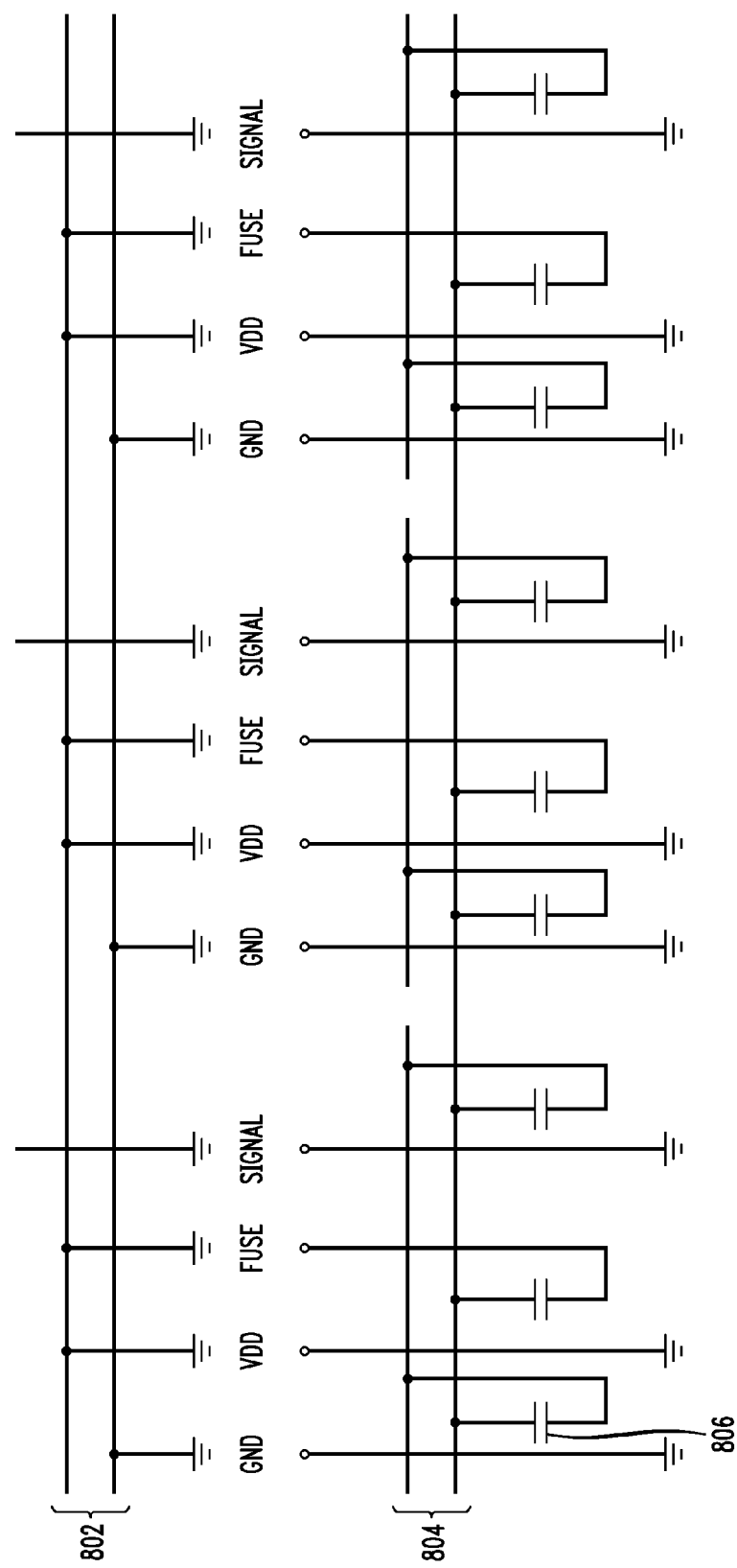
FIG. 8 is a circuit diagram illustrating an exemplary electronic device comprising an interposer structure having a plurality of capacitors integrated therein which can be selectively deactivated according to an embodiment of the present invention.

FIG. 8 is a circuit diagram illustrating an exemplary electronic device 800 comprising an interposer structure having a plurality of capacitors integrated therein which can be selectively deactivated. Electronic device 800 comprises IC chip 802 and interposer structure 804. Interposer structure 804 provides a connection for GND, VDD and signal. Decoupling capacitors, such as decoupling capacitor 806, ate associated with the GND and VDD circuits. The decoupling capacitors are grouped, forming discrete blocks, as described above. Each grouping contains a GND, VDD, signal and, as will be described below, a fuse. A fuse bump is a bump that can be electrically opened to cause a non electrically conducting path much the same as a fuse is used to limit current flow from too high current or otherwise creates an open in the circuit.

Namely, a fuse is included in circuit with the VDD. If one or mote of the decoupling capacitors for a given block of decoupling capacitors is defective, that block can be selectively deactivated by intentionally "blowing" the fuse, e.g., by passing a current through the fuse sufficient enough to open the circuit. As such, power to that block of defective decoupling capacitors will be eliminated. As will be described below, conductive straps and fuses are examples of a number of removable connections that are anticipated herein for selectively deactivating a capacitor(s).

Figure 9:
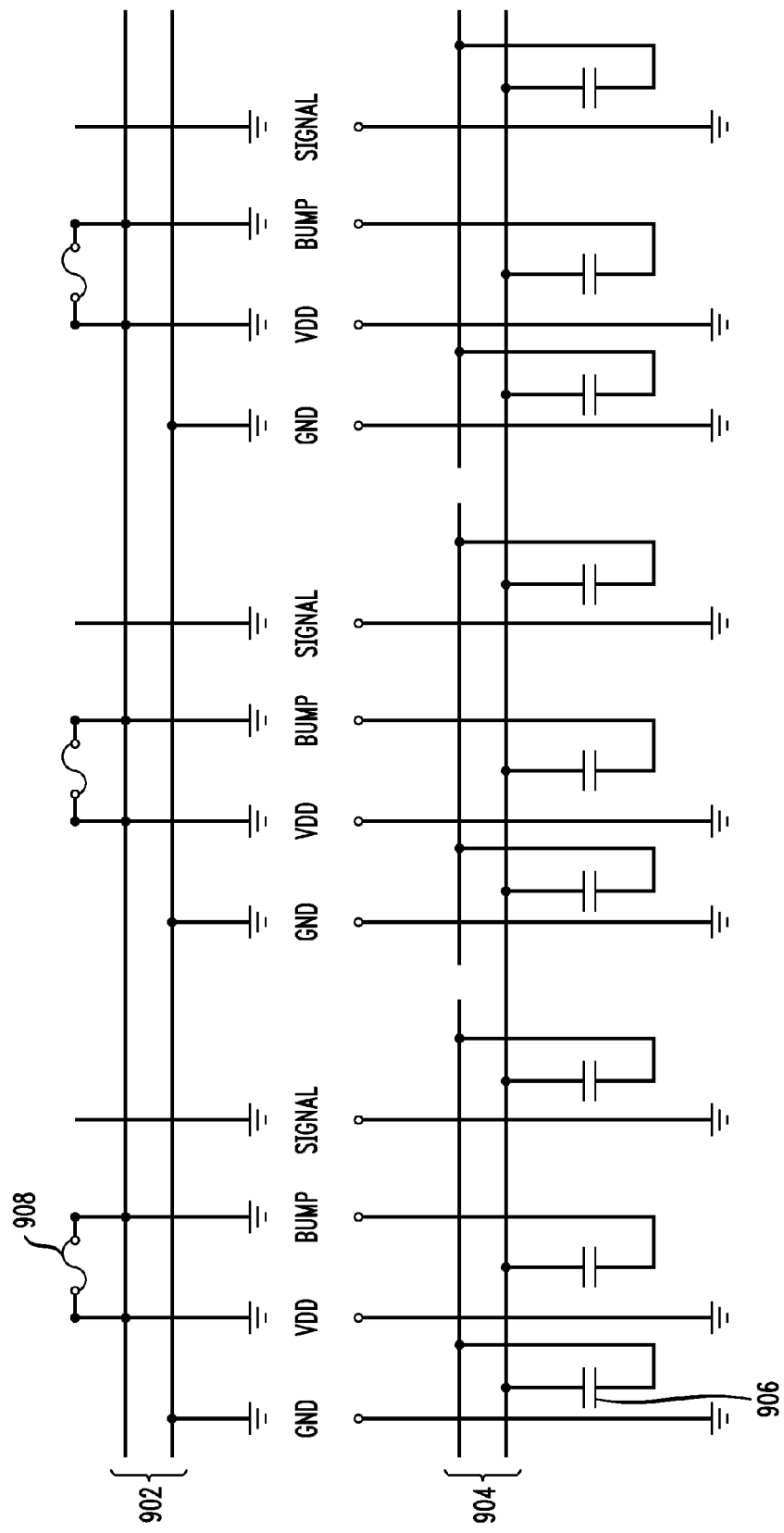
FIG. 9 is a circuit diagram illustrating an exemplary electronic device comprising an interposer structure having a plurality of capacitors integrated therein which can be selectively eliminated according to an embodiment of the present invention.

FIG. 9 is a circuit diagram illustrating an exemplary electronic device 900 comprising an interposer structure having a plurality of capacitors integrated therein which can be selectively deactivated. Electronic device 900 comprises IC chip 902 and interposer structure 904. Interposer structure 904 provides a connection for GND, VDD and signal. Decoupling capacitors, such as decoupling capacitor 906, are associated with the GND and VDD circuits. The decoupling capacitors ate grouped, forming discrete blocks, as described above. Each grouping contains a GND, VDD and a signal.

As described in conjunction with the description of FIG. 8, above, a fuse is included in circuit with the VDD. However, the fuse, e.g., fuse 908, is present on the IC chip side of the device. One or more additional removable connections, e.g., a removable contact bump, i.e., labeled "Bump" in FIG. 9, may be employed in circuit with the VDD.

Figure 10:
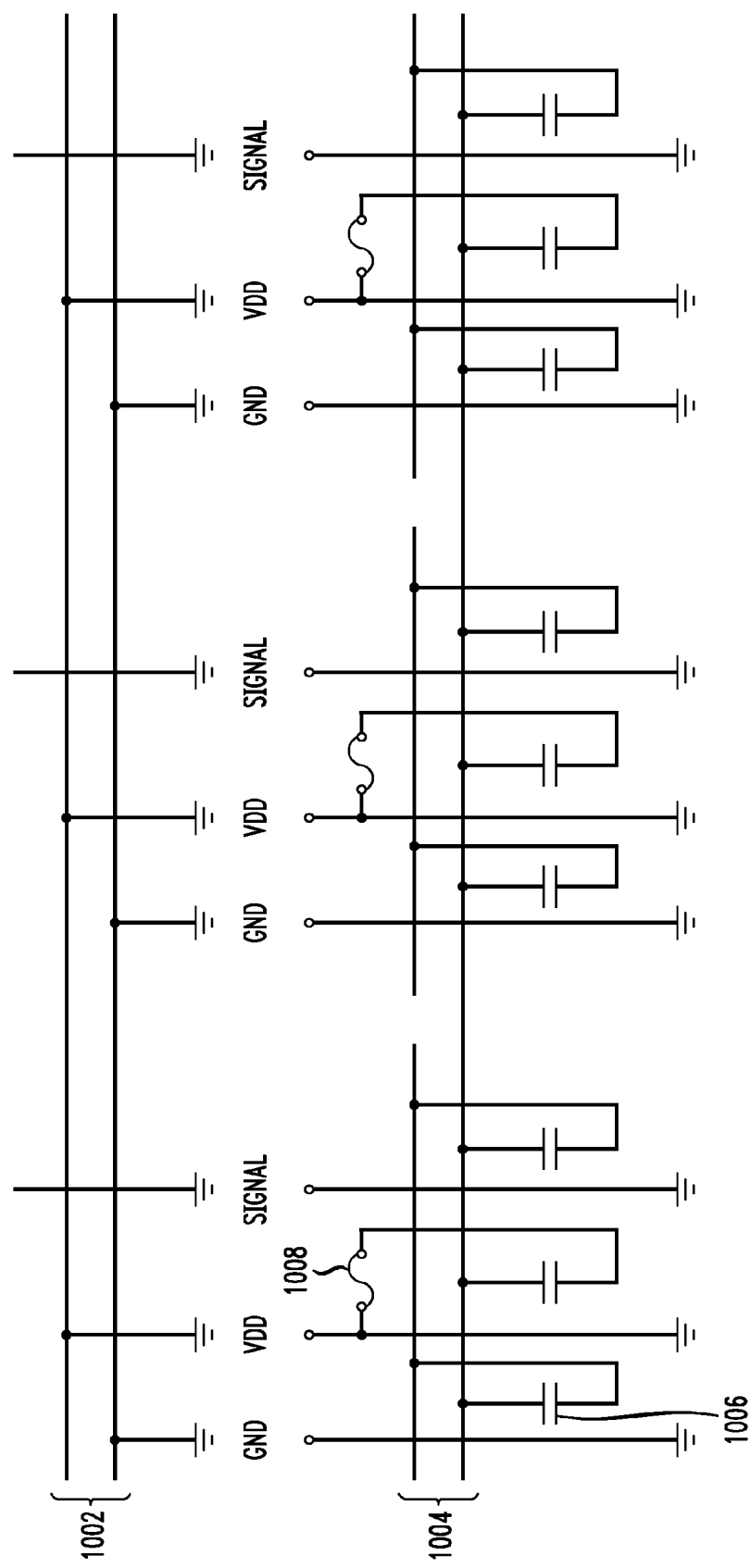
FIG. 10 is another circuit diagram illustrating an exemplary electronic device comprising an interposer structure having a plurality of capacitors integrated therein which can be selectively eliminated according to an embodiment of the present invention.

FIG. 10 is a circuit diagram illustrating an exemplary electronic device 1000 comprising an interposer structure having a plurality of capacitors integrated therein which can be selectively eliminated. Electronic device 1000 comprises IC chip 1002 and interposer structure 1004. Interposer structure 1004 provides a connection for GND, VDD and signal. Decoupling capacitors, such as decoupling capacitor 1106, are associated with the GND and VDD circuits. The decoupling capacitors are grouped, forming discrete blocks, as described above. Each grouping contains a GND, VDD and a signal.

As described in conjunction with the description of FIG. 9, above, a fuse is included in circuit with the VDD. However, the fuse, e.g., fuse 1008, is present on the interposer structure side of the device. As described above, if one or more of the decoupling capacitors for a given block of decoupling capacitors is defective, that block can be selectively removed, deactivated, by intentionally "blowing" the fuse, e.g., by passing a current through the fuse sufficient enough to open the circuit. As such, power to that block of decoupling capacitors will be eliminated.

In conclusion, the techniques presented herein allow for effective decoupling capacitance to be provided for electronic devices wherein flee space is at a premium, while at the same time maintaining proper path lengths to the components. Further, the techniques presented herein accommodate one or more defective components without sacrificing the entire device or entire portions of the device.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. An electronic device comprising:
   at least one interposer structure having one or more vias and a plurality of decoupling capacitors integrated therein, the at least one interposer structure having a configuration which enables one or more of the plurality of decoupling capacitors to be selectively deactivated, wherein the at least one interposer structure further comprises one or more active circuits integrated therein, wherein the at least one interposer structure comprises a passivation layer over at least a portion of one or more of the plurality of decoupling capacitors, and wherein the passivation layer comprises an organic polymer.

2. The device of claim 1, wherein the plurality of decoupling capacitors comprise one or more of parallel plate decoupling capacitors and trench decoupling capacitors.

3. The device of claim 1, wherein the plurality of decoupling capacitors comprise at least one parallel plate decoupling capacitor and at least one trench decoupling capacitor.

4. The device of claim 1, wherein the plurality of decoupling capacitors are grouped into one or more blocks within the at least one interposer structure.

5. An The electronic device of claim 1, further comprising a plurality of additional interposer structures in a stacked configuration.

6. The device of claim 1, further comprising an integrated circuit chip in electrical contact with a side of the at least one interposer structure.

7. The device of claim 6, further comprising one or more of a ceramic substrate, organic substrate or Si substrate and a printed circuit board in electrical contact with a side of the at least one interposer structure opposite the integrated circuit chip.

8. The device of claim 1, wherein one or more of the plurality of decoupling capacitors comprise a high k dielectric material.

9. The device of claim 8, wherein the high k dielectric material is selected from the group consisting of silicon nitride, silicon oxinitride, tantalum oxide, titanium oxide, aluminum oxide, zirconium oxide, hafnium oxide, hafnium silicon oxide, barium strontium titanate, barium zirconium titanate, barium titanium oxide, barium-strontium and combinations comprising at least one of the foregoing materials.

10. An electronic device comprising:
   at least one interposer structure having one or more vias and a plurality of decoupling capacitors integrated therein, the at least one interposer structure having a configuration which enables one or more of the plurality of decoupling capacitors to be selectively deactivated; and
   one or more removable connections electrically connecting one or more of the plurality of decoupling capacitors to one or more other of the plurality of decoupling capacitors.

11. The device of claim 10, wherein at least one of the removable connections comprises a fuse.

12. The device of claim 10, wherein at least one of the removable connections comprises a removable bump.

13. The device of claim 10, wherein at least one of the removable connections comprises a conductive strap.

14. The device of claim 13, wherein at least a portion of the conductive strap can be removed using laser deletion techniques.

15. An integrated circuit, comprising:
   an electronic device having at least one interposer structure having one or more vias and a plurality of decoupling capacitors integrated therein, the at least one interposer structure having a configuration which enables one or more of the plurality of decoupling capacitors to be selectively deactivated, wherein the at least one interposer structure further comprises one or more active circuits integrated therein, wherein the at least one interposer structure comprises a passivation layer over at least a portion of one or more of the plurality of decoupling capacitors, and wherein the passivation layer comprises an organic polymer.

* * * * *